United States Patent [19]
Frisina et al.

[11] Patent Number: 5,227,315
[45] Date of Patent: Jul. 13, 1993

[54] PROCESS OF INTRODUCTION AND DIFFUSION OF PLATINUM IONS IN A SLICE OF SILICON

[75] Inventors: Ferruccio Frisina, Catania; Nella Tavolo, Scordia; Mario Raspagliesi, San Giovanni La Punta, all of Italy

[73] Assignee: Consorzio Per La Ricerca Sulla Microelettronica Nel Mezzogiorno, Catania, Italy

[21] Appl. No.: 794,390

[22] Filed: Nov. 19, 1991

[30] Foreign Application Priority Data

Nov. 29, 1990 [IT] Italy .................. 22237 A/90

[51] Int. Cl.$^5$ .......................... H01L 21/265
[52] U.S. Cl. .................. 437/24; 437/11; 437/142; 257/49
[58] Field of Search ............. 437/142, 24, 11; 357/15, 38

[56] References Cited

U.S. PATENT DOCUMENTS

| | | | |
|---|---|---|---|
| 3,953,243 | 4/1976 | Goetzberger et al. | 437/11 |
| 4,137,370 | 1/1979 | Fujishiro et al. | 428/668 |
| 4,165,517 | 8/1979 | Temple et al. | 357/38 |
| 4,620,211 | 10/1986 | Baliga et al. | |
| 4,717,588 | 1/1988 | Wilson et al. | |
| 4,742,017 | 5/1988 | Bredthauer | 357/15 |
| 4,777,149 | 10/1988 | Tanabe et al. | 437/142 |
| 4,855,799 | 8/1989 | Tanabe et al. | |
| 4,875,082 | 10/1989 | Bredthauer | 357/15 |
| 4,925,812 | 5/1990 | Gould | 437/142 |
| 5,032,540 | 7/1991 | Follegot | 437/142 |

FOREIGN PATENT DOCUMENTS 59-075662 4/1984 Japan.
62-062557 3/1987 Japan.

Primary Examiner—Brian E. Hearn
Assistant Examiner—Kevin M. Picardat
Attorney, Agent, or Firm—Kenneth C. Hill

[57] ABSTRACT

A process is provided for introduction and diffusion of platinum ions in a slice of silicon material. The slice of silicon is subjected to a succession of thermal steps at high temperature for the formation of at least one semiconductor device. Later processing steps include the opening of contacts and surface metallization. Platinum ions are introduced by ionic implant prior to the metallization step.

13 Claims, 1 Drawing Sheet

PROCESS OF INTRODUCTION AND DIFFUSION OF PLATINUM IONS IN A SLICE OF SILICON

BACKGROUND OF THE INVENTION

1. Field of the Invention

The present invention relates to a process of introduction and diffusion of platinum ions in a slice of silicon containing semiconductor devices.

2. Description of the Prior Art

The need to reduce the lifetime of minority carriers in semiconductor devices derives from different application needs for different types of devices. Device types for which this is a concern include power MOSFETs, fast diodes, insulated gate bipolar transistors (IGBT), bipolar power transistors and thyristors. The object of reducing minority carrier lifetime is to reduce the turn off times of the devices. This reduces energy losses without worsening static device characteristics.

The techniques most commonly used to reduce the minority carrier lifetimes in semiconductor devices include the deposition of gold, the deposition of platinum, and electron radiation.

The deposition of gold is frequently used but it produces two undesired effects. First of all, it causes a considerable increase in leakage current, especially with increasing temperatures. Also, it causes a substantial increase in the resistivity of the silicon of the device.

Although electron radiation does not cause high leadage currents, it does create considerable damage to the Si-SiO$_2$ interface. This shows up as a lowering of the threshold voltage for MOS devices. The technique can also be sensitive to thermal processes at low temperature (in the range of, for example, 400°–500° C.) such as the processes for attaching a die to its support, normally called die attach.

The deposition of platinum offers several advantages. These include low leakage current, and stability to thermal processes at low temperature (below 700° C.). In addition, compared with the process that uses the deposition of gold, deposition of platinum has lower variations in the resistivity of the resulting silicon.

The process currently in use according to the known art consists in the introduction of platinum into the slice of silicon through a process of deposition on the rear of the slice. This is followed by a process of diffusion at a temperature of approximately 900° C. With this process, a thin layer of silicon oxide is formed during the diffusion. This thin layer of oxide stops further diffusion of the platinum into the slice.

One method for eliminating the layer of silicon oxide provides for the deposition over the surface of the semiconductor of a layer of palladium prior to deposition of the platinum. This has the purpose of facilitating the diffusion of the platinum. As an alternative, platinum silicides suitable for encouraging the diffusion of the platinum into the semiconductor can be formed at the silicon Si-Pt interface. Both of these methods are described in U.S. Pat. No. 4,925,812.

In any case, even when more complicated processes are used, deposition of platinum has substantial limitations. In the first place, the quantity of platinum diffused into the silicon is determined by the thermal diffusion process and by the solid solubility of the platinum in the silicon. In the second place, since the concentration of platinum is equal to the solid solubility, the surface behaves as an infinite source. This causes the distribution of platinum along the length of the slice to be highly uneven. Lastly, the deposition of platinum can be executed only on the rear of the slice of the semiconductor. This does not allow the introduction of platinum in silicon areas bounded by masking.

If it is desired deposit of platinum in well-defined areas on the front of the slice, such deposition is not possible according to the known prior art processes.

SUMMARY OF THE INVENTION

It is therefore an object of the present invention to overcome the described drawbacks with a process which allows the introduction of a controlled quantity of platinum ions into a slice of semiconductor material. The platinum may be introduced from the rear or from the front areas defined by masking. The quantity of platinum introduced is lower than the solid solubility, and its distribution is uniform inside the slice of material and over the slice itself. This results in resistivity profiles which are constant along the entire thickness and surface of the slice of the semiconductor.

Another object of the invention is to provide for manufacturing semiconductor devices having enhanced dynamic characteristics.

Therefore, according to the present invention, a process is provided for introduction and diffusion of platinum ions in a slice of silicon material. The slice of silicon is subjected to a succession of thermal steps at high temperature for the formation of at least one semiconductor device. Later processing steps include the opening of contacts and surface metallization. Platinum ions are introduced by ionic implant prior to the metallization step.

BRIEF DESCRIPTION OF THE DRAWINGS

The features of the present invention shall be made more evident by its embodiments illustrated as a non-limiting example in the enclosed drawings, wherein.

DESCRIPTION OF THE PREFERRED EMBODIMENT

According to one embodiment of the present invention, an implant of platinum ions is performed on the rear of the slice of silicon before the formation of contact openings and metallization. As an alternative, the process of the present invention provides for the implant of platinum ions on the front of the silicon slice after the formation of contacts and before the metallization step.

Utilizing the steps of the invention, it is possible to introduce into the silicon a perfectly controlled and defined quantity of platinum. The platinum may be introduced from the rear of the slice, or from the front of the slice in areas that are defined by masking. When the ionic implant is performed from the rear, the distribution of platinum obtained is perfectly uniform (with no discontinuities) over the entire surface of the slice having a size of from approximately 4 to 8 inches. It has also been shown experimentally, that in the case of ionic implant, all of the devices on the slice itself receive the same quantity ions.

After ion implant, a diffusion step is performed at a temperature of between approximately 850° C. to 1000° C. in a nitrogen atmosphere. This prevents some of the platinum from evaporating from the surface of the slice. It has been found that nitridization takes place at the surface, which confines the platinum inside the silicon.

The diffusion temperature is such as to have no effect at all on the junctions already formed in the silicon, with their depth remaining totally unchanged.

The described process according to the invention can be accomplished, for example, with equipment such as that described in European Patent Application No. 0439220 published on Jul. 31, 1991.

The use of the process according to the invention is especially suitable for power MOS and IGBT devices but is also applicable to bipolar structures. It has several advantages over the techniques commonly used:

a) It substantially simplifies the processing.

It allows the introduction, with a very high uniformity on a slice, of a perfectly controlled quantity of platinum ions that is lower than the solid solubility. This functions as a finite source of platinum ions at the surface, which is the only technique that makes it possible to obtain perfectly flat concentration profiles along the thickness of the slice.

c) When the ionic implant is executed from the rear, it allows a uniform distribution of platinum to be obtained over the entire surface of a slice. Slices having sizes from 4 to 8 inches can be made to have such uniform distribution.

d) It has the advantage that platinum ions can also be introduced from the front of the slice through masking windows.

Figure 1:
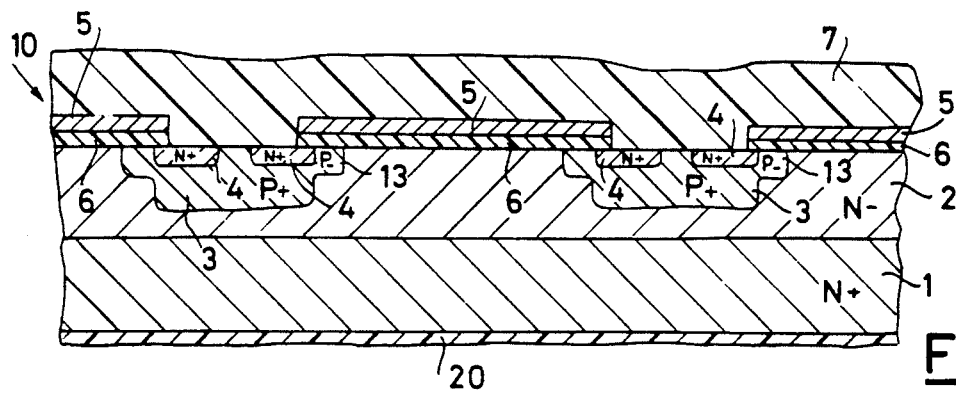
FIG. 1–3 illustrate an embodiment of the process according to the invention.

With reference now to FIG. 1, a number of process steps have been performed to fabricate a semiconductor device of the power MOS type indicated generally as reference number 10. On a highly doped N+ type substrate 1, an epitaxial layer 2 having an N− doping is formed. Epitaxial layer 2 has a high resistivity, preferably from 20 to 100 ohm-cm. Within the epitaxial layer 2, body regions 3 are formed having a P+ conductivity type Inside each P+ region 3, a pair of N+ regions and a pair of P− channel regions 13 are also formed.

Over the epitaxial layer 2, between each pair of body regions 3, a gate oxide 6 has been formed. On the gate oxide 6, there is formed a layer of polycrystalline silicon 5 constituting the gate electrode. Over the entire upper surface, or front, of the device there has been deposited a passivating oxide 7. Passivating oxide layer 7 has the function of separating the gate electrodes 5 from the subsequent source metallization. At this point all high temperature thermal process steps have been performed.

Figure 2:
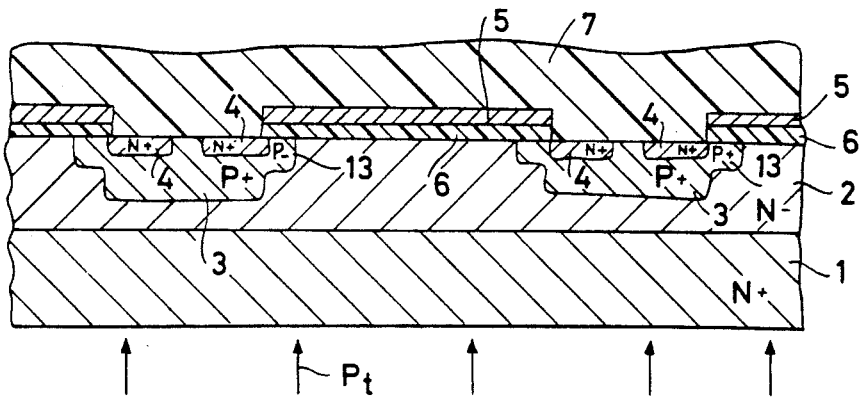

As illustrated in FIG. 2, the process according to the invention now provides for the removal of a layer of oxide 20 on the rear of the substrate 1. Oxide layer 20 is preferably removed using a chemical etch. Following removal of oxide layer 20, an implant of platinum ions (Pt) is performed with an energy of 40 KeV. The dose of the implant varies, from $1 \times 10^{12}$ atoms/cm$^2$ to $1 \times 10^{14}$ atoms/cm$^2$ depending on the device. The selection of the dose depends on the value of the desired lifetime of the minority carriers, and on the resistivity of the N− epitaxial layer 2.

A perfect dependence has in fact been found between implant dose and lifetime. Moreover, the introduction of platinum in silicon increases its resistivity. Such increment is larger with a high starting resistivity and with a high quantity of platinum introduced.

After the platinum implant process there follows a diffusion in nitrogen atmosphere at a temperature ranging from 850° C. to 1000° C., and for a time ranging between 1 hour and 10 hours. The described temperature and times of dirfusion are such as not to alter the depths of the junctions already formed.

Figure 3:
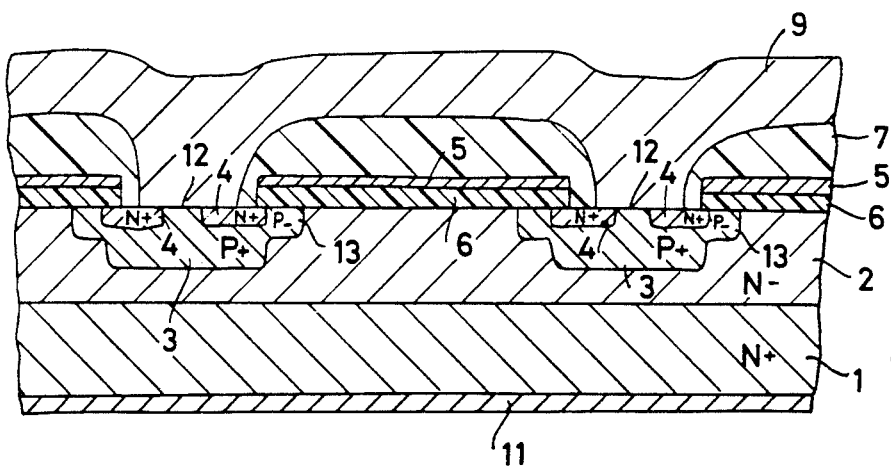

As illustrated in FIG. 3, opening of the contacts then follows by etching the passivating oxide 7 to define windows 12. Underlying SOurce regions 4 are exposed through the windows 12. The oxide 7 remains only to insulate completely the 9ate electrodes 5 from a further layer of source metallization 9 subsequently deposited over the entire surface of the device. A further metallization layer 11 is subsequently deposited on the rear of the substrate 1 to form the drain metallization.

Figure 4:
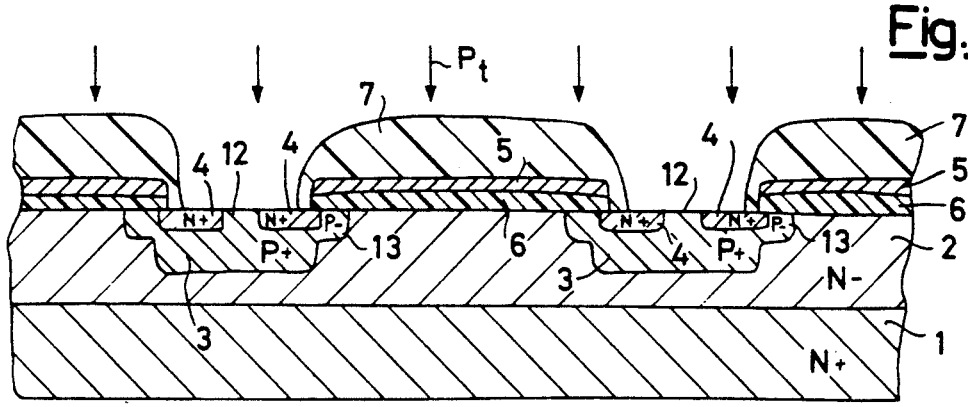
FIG. 4 illustrates process steps that are alternatives to those illustrated in FIG. 2.

According to an alternative embodiment, starting from the situation illustrated in FIG. 1, the passivating oxide 7 is then etched at areas 12 to expose the source regions 4. Such etching is followed, as illustrated in FIG. 4, by implanting platinum on the front of the device in the direction indicated by the arrows. This is followed by the subsequent diffusion of the platinum in the device as described above. These steps are followed by the deposition of the metallization layers 9, 11 in the same manner described in connection with FIG. 3.

In general terms it should be noted that the quantity of platinum ions implanted from either the front or from the rear and distributed inside the silicon, due to the particular diffusion mechanism, tends to be distributed over the surfaces.

When the Pt source is infinite, as in the case of the deposition of Pt, in accordance with the teachings of the prior art, the resulting concentration profile is a perfectly symmetrical U-shaped profile. In order to obtain flat concentration profiles, very long diffusion times are then necessary. (For example, from 10 to 20 hours). The resulting concentration cannot be controlled, but rather depends on the solid solubility at the diffusion temperature.

When the Pt implant according to the invention is used, the concentration profile still has a U-shape. However, it is possible to arrange for the number of implanted atoms be lower than the value of the solid solubility at the diffusion temperature. In practice, this acts as finite source of Pt. This causes the distribution along the thickness of the slice to be constant even for very short diffusion times (from 0.5 to 2 hours) with the concentration being determined by the implant dose.

Since the resistivity of the silicon is increased by the concentration of Pt in a manner proportional to the concentration of Pt and to the resistivity of the silicon, it follows that the resistivity profiles also follow the platinum concentration profiles.

Thus the invention allows for the introduction, of high concentrations of Pt in the silicon ($10^{15}$–$10^{17}$ atoms/cm$^3$) even for high silicon resistivities (about 20–100 ohm-cm). This results in obtaining perfectly flat and controlled resistivity profiles along the thickness of the slice of silicon. It has been found that this gives the best performance of the resulting device in terms of output resistance and switching losses.

It has also been found that, in the case of ionic implant, all the devices in the slice receive the same quantity of platinum ions.

While the invention has been particularly shown and described with reference to a preferred embodiment, it will be understood by those skilled in the art that various changes in form and detail may be made therein without departing from the spirit and scope of the invention.

What is claimed is:

1. A process of introduction and diffusion of platinum ions in a slice of silicon, comprising subjecting the slice to a succession of thermal steps at high temperature for the formation of at least one semiconductor device and to subsequent steps for the opening of contacts and for surface metallizaiton, characterized in that the introduction of platinum ions is performed by ionic implant before the metallization step, wherein the implant of the platinum ions takes place with a dose that is lower than the solid solubility in the semiconductor at the diffusion temperature, and wherein a time of diffusion is used so as to obtain, once the diffusion has taken place, a profile of resistivity that is constant throughout the entire thickness of the slice of silicon.

2. The process according to claim 1, characterized in that the implant of the platinum ions is performed on the rear of the slice of silicon before the formation of the contacts and of the metallization step.

3. The process according to claim 1, characterized in that the implant of the platinum ions is performed on the front of the slice of silicon after the formation of the contacts and before the metallization step.

4. The process according to claim 1, characterized in that said dose ranges from 1012 atoms/cm2 to 1014 atoms/cm2.

5. The process according to claim 1, characterized in that the diffusion of platinum in the slice of silicon takes place in a nitrogen atmosphere.

6. The process according to claim 1, characterized in that the time of diffusion ranges from 1 to 10 hours.

7. The process according to claim 1, characterized in that said semiconductor device is a power MOS device.

8. The process according to claim 1, characterized in that said semiconductor device is an Insulated Gate Bipolar Transistor device.

9. A method for forming a semiconductor device, comprising the steps of:
    forming at least one active semiconductor device in a silicon slice, including formation of an overlying insulating layer;
    implanting platinum ions into the slice; diffusing the implanted ions through the slice for a time and at a temperature sufficient to obtain a concentration profile for the platinum which is substantially constant throughout the thickness of the substrate;
    forming contact opening through the insulating layer; and
    metallizing the device, including forming metal contacts to the slice through the openings in the overlying insulating layer.

10. The method of claim 9, wherein said step of forming contact openings is performed before said implanting step, and the platinum is implanted into the slice through the openings in the overlying insulating layer.

11. The method of claim 9, wherein said step of forming contact openings is performed after said diffusing step, and wherein the platinum is implanted into the slice through a surface opposite the overlying insulating layer.

12. The method of claim 9, wherein the concentration of implanted platinum is less than the solid solubility of platinum in the slice material at the diffusion temperature.

13. The method of claim 9, wherien said diffusion step comprises the step of heating the slice in a nitrogen atmosphere.

* * * * *